United States Patent [19]

Dawson

[11] 4,005,466  
[45] Jan. 25, 1977

[54] PLANAR VOLTAGE VARIABLE TUNING CAPACITORS

[75] Inventor: Robert Herman Dawson, Kingston, N.J.

[73] Assignee: RCA Corporation, New York, N.Y.

[22] Filed: May 7, 1975

[21] Appl. No.: 575,421

[52] U.S. Cl. .................................. 357/14; 357/23; 357/24; 317/231; 317/233

[51] Int. Cl.² ................. H01L 29/92; H01L 29/78; H01G 9/00; H01G 9/18

[58] Field of Search ................. 357/14, 15, 23, 24; 317/231, 233

[56] References Cited

UNITED STATES PATENTS

| | | | |
|---|---|---|---|
| 3,411,053 | 11/1968 | Wiesner | 357/14 |
| 3,495,137 | 2/1970 | Franks et al. | 357/14 |
| 3,644,850 | 2/1972 | Ho | 357/14 |
| 3,810,125 | 5/1974 | Stein | 357/24 |

FOREIGN PATENTS OR APPLICATIONS 1,639,453  3/1970  Germany .................. 357/14

*Primary Examiner*—Andrew J. James  
*Attorney, Agent, or Firm*—H. Christoffersen; R. P. Williams; R. A. Hays

[57] ABSTRACT

A voltage variable tuning capacitor structure is disclosed. A pair of metal-insulator-semiconductor (MIS) capacitors are fabricated in a body of semiconductor material in back-to-back configuration. The back-to-back configuration reduces the effect of intermodulation distortion. The device has a relatively high quality factor, Q, because of a relatively low transverse resistance which is provided by a doped region between the pair of capacitors. The device may be used for the electronic tuning of integrated RF receivers for television, VHF, UHF, AM or FM tuners.

4 Claims, 1 Drawing Figure

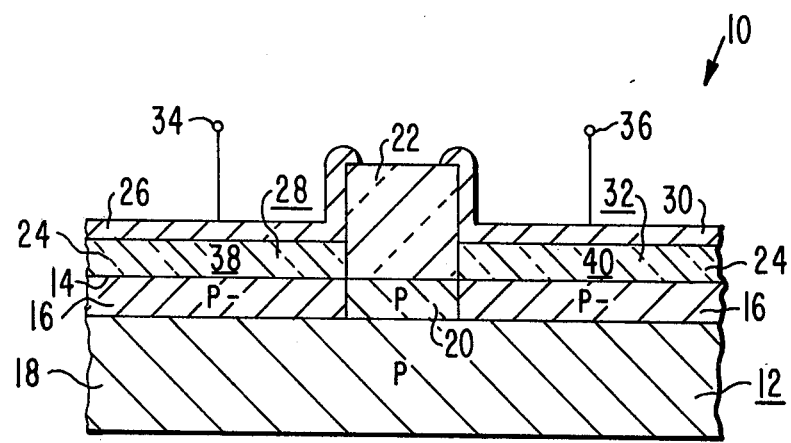

PLANAR VOLTAGE VARIABLE TUNING CAPACITORS

The present invention generally relates to MIS voltage variable capacitors and particularly relates to a pair of MIS voltage variable capacitors connected in a back-to-back configuration in a body of semiconductor material and having a relatively high quality factor.

It is known in the semiconductor art to use an MIS voltage variable capacitor for the purpose of switching between two values of capacitance. However, it has been difficult to employ the transition state between capacitance values for tuning because the transition state is very sensitive to overdrive from interferring signals, which may cause intermodulation distortion and cross modulation distortion. These interfering signals also tend to cause a shift in the bias point of the device and thus detune the circuit.

In the drawing:

The single FIGURE is a partial cross-sectional view of the present device, not drawn to scale.

The present device, having a planar type structure, indicated at 10 in the FIGURE comprises a body 12 of semiconductor material having a surface 14 and having one type conductivity, for example P type. The body 12 contains at least a first region 16 and a second region 18. Preferably the first region 16 is adjacent the surface 14 and has a carrier concentration on the order of about $10^4$ atoms/cm$^3$ lower than that of the second region 18. The second region 18 preferably has a carrier concentration between from about $10^{18}$ atoms/cm$^3$ to about $10^{20}$ atoms/cm$^3$. The first region than has a carrier concentration between from about $10^{14}$ atoms/cm$^3$ to about $10^{16}$ atoms/cm$^3$.

A third region 20 of semiconductor material having the one type conductivity is within the first region 16. The third region 20 is adjacent the surface 14 and extends through the first region 16 to the second region 18. Preferably the carrier concentration of the third region 20 is at least about the same as that of the second region 18.

In the preferred device a layer 22 of insulating material overlies at least substantially all of the third region 20. The layer 22 may be, for example, silicon dioxide. A layer 24 of dielectric material is adjacent the surface 14 and overlies the first region 16 of semiconductor material. The layer 24 may be, for example, silicon dioxide, silicon nitride, or the like. The layer 22 should be on the order of from between about 10 to about 5 times as thick as the layer 24 of dielectric material.

A first electrode 26 overlies a first portion 28 of the layer 24 of dielectric material which overlies the first region 16. A second electrode 30 overlies a second portion 32 of the layer 24 of dielectric material. The second electrode 30 is insulatingly separated from the first electrode 26, and the third region 20 is in the electrical path between the first electrode 26 and the second electrode 30.

First and second terminal means, 34 and 36 respectively, are in electrical contact with the first and second electrodes, 26 and 30 respectively.

One method of fabricating the present device 10 is to begin with a body of semiconductor 12, preferably silicon, which has been cleaned and polished in a conventional manner. The first region 16 and the second region 18 may be formed by methods known in the semiconductor art. For example, the first region 16 may be an epitaxially grown layer of semiconductor material. As another example, the first region 16 may be diffused or ion implanted into the body 12. In such a case, the body 12 would then be attached to a handle, not shown in the drawings, and lapped and polished to yield the desired thickness of the first region 16. The preferred method of forming the first region 16 is by an epitaxial growth. In the preferred example the body 12 constitutes the second region 18.

The third region 20 may be formed in the first region 16 by methods known in the art, such as doped oxide diffusion, ion implantation, or the like. In the preferred example, that is, formation by a doped oxide diffusion, the oxide remaining after the dopant has been driven into the first region 16 is not removed. This then is designated as the layer 22 of insulating material. Allowing the layer 22 to remain is a matter of convenience since processing steps are saved. The layer 24 of dielectric material, for example silicon dioxide, may be formed adjacent the surface 14 by methods known in the art, for example it may be thermally grown.

The first and second electrodes 26 and 30 respectively, are then formed by methods known in the semiconductor art, for example, by RF sputtering, chemical vapor deposition, or the like. The material of the first and second electrodes 26 and 30 respectively may be any conductive material which is compatible to the method of formation.

It will be understood that the device 10 is comprised of a pair of voltage variable capacitors having a first capacitor member 38 and a second capacitor member 40. THe first capacitor member 38 is comprised of the first electrode 26, which may be designated as one plate thereof, the first portion 28, and the first region 16 of semiconductor material thereunder. The second capacitor member 40 is comprised of the second electrode 30, which may be designated as one plate thereof, the second portion 32, and the first region 16 of semiconductor material thereunder. The first and second capacitor members 38 and 40 respectively share, as a common node, the second region 18. The third region 20 provides a current path between them. The layer 22 of insulating material reduces the overlap capacitance between the first capacitor member 38 and the second capacitor member 40.

The present device 10 may be utilized as one component in a hybrid circuit or it may be fabricated as one element of an integrated circuit. The device 10 may be used in conjunction with an inductive component, either lumped or integrated, to provide a tuning circuit.

Since the actual maximum and minimum values of the device 10 depend on the dielectric properties of the layer 24 of dielectric material and the thickness of layer 24 covered by the first and second electrodes 26 and 30 respectively, it will be understood that a relatively wide range of capacitance values are available across the first and second terminal means 34 and 36 respectively.

Capacitors connected in the general manner of device 10 are said to be in a back-to-back configuration. That is, a back-to-back configuration is where a plate of one capacitor is connected through resistive means to a plate of another capacitor. In the device 10 the third region 20 may be designated as the resistive means. In this configuration the overall capacitance of the device 10 is related to the square root of the applied voltage, as is known in the art. Thus the present device 10 is less susceptible to any voltage intermodulation distortion. That is, any voltage distortion has a reduced effect on the device 10 because of the square root voltage dependance.

The present device 10 also has a relatively high quality factor. In order to understand this it should be noted that the third region 20 has a higher, on the order of about $10^4$ atoms/cm$^3$, carrier concentration than the first region 16. Thus the third region 20 has a relatively lower resistivity than the first region 16. In this case, the resistivity may be viewed as a series transverse resistance between the first capacitor member 38 and the second capacitor member 40 and may be designated as $R_s$. The relationship of the quality factor, Q, to the series transverse resistance, $R_s$, is given by the known equation: $Q = 1/(2\pi fCR_s)$ where $f$ is the frequency of operation and C is the value of capacitance. It follows from the above equation that Q is inversely proportional to $R_s$, and is relatively high since $R_s$ is low.

What is claimed is:

1. A planar semiconductor device comprising:
   a body of semiconductor material having one type conductivity and having a surface, said body having a first region and a second region therein, said first region being adjacent said surface and having a lower carrier concentration than said second region;
   a third region of semiconductor material having said one type conductivity within said first region, said third region being adjacent said surface and extending through said first region to said second region, said third region having a carrier concentration on the order of that of said second region;
   a layer of dielectric material overlying said first region;
   a first electrode overlying a first portion of said layer of dielectric material; and
   a second electrode overlying a second portion of said layer of dielectric material, said second electrode being insulatingly separated from said first electrode, said third region being in the electrical path between said first electrode and said second electrode.

2. A planar semiconductor device as claimed in claim 1 wherein:
   said first region has a carrier concentration on the order of about $10^4$ atoms/cm$^3$ lower than said body of semiconductor material.

3. A planar semiconductor device as claimed in claim 1 wherein:
   said second region has a carrier concentration of between about $10^{18}$ atoms/cm$^3$ to about $10^{20}$ atoms/cm$^3$; and
   said first region has a carrier concentration of between about $10^{14}$ atoms/cm$^3$ to about $10^{16}$ atoms/cm$^3$.

4. A planar semiconductor voltage variable capacitor tuning device comprising:
   at least one pair of voltage variable capacitors connected in back-to-back configuration, fabricated in a body of semiconductor material having one type conductivity and a first region of semiconductor material adjacent a surface thereof and having the same type conductivity therein;
   a third region of semiconductor material in said first region being adjacent said surface and extending therethrough, said first region having a lower carrier concentration than said third region, said third region providing a current path between each member of said pair of capacitors; and
   terminal means electrically contacting one plate of each said member of said pair of capacitors.

* * * * *